(12) United States Patent
Kind

(10) Patent No.: US 7,225,038 B2
(45) Date of Patent: May 29, 2007

(54) METHOD AND SYSTEM FOR CHECKING CONSISTENCY AND COMPLETENESS OF SELECTION CONDITIONS IN A PRODUCT CONFIGURATION SYSTEM

(75) Inventor: Jaakob Friedrich Kind, Heidelberg (DE)

(73) Assignee: SAP AG, Walldorf (DE)

( * ) Notice: Subject to any disclaimer, the term of this patent is extended or adjusted under 35 U.S.C. 154(b) by 684 days.

(21) Appl. No.: 10/670,602

(22) Filed: Sep. 26, 2003

(65) Prior Publication Data

US 2005/0071146 A1 Mar. 31, 2005

(51) Int. Cl.
*G06F 19/00* (2006.01)
(52) U.S. Cl. ........................................... 700/95
(58) Field of Classification Search ............... 700/95, 700/96, 97, 103, 104, 107
See application file for complete search history.

(56) References Cited

U.S. PATENT DOCUMENTS 5,119,307 A * 6/1992 Blaha et al. ................ 700/107
6,223,094 B1 * 4/2001 Muehleck et al. .......... 700/107
2002/0165701 A1 * 11/2002 Lichtenberg et al. .......... 703/7
2003/0177114 A1 * 9/2003 Lin et al. ....................... 707/3
2003/0204527 A1 * 10/2003 Callahan .................... 707/104.1
2004/0140976 A1 * 7/2004 Callahan ..................... 345/419

OTHER PUBLICATIONS

Wongvasu et al., "Represneting the relationship between items in logical bill-of-material to support customers' request for quotation for make-to-order produts", 2000, proceedings of SPIE, vol. 4192, pp. 74-84.*
Wongvasu et al. "Trie Representation for Expressing the Compatibility Between Items in a Logical Bill of Material Structure", 2001, Proceedings of SPIE, vol. 4565 pp. 84-90.*

* cited by examiner

*Primary Examiner*—Albert W. Paladini
*Assistant Examiner*—Chad Rapp
(74) *Attorney, Agent, or Firm*—Kenyon & Kenyon LLP

(57) ABSTRACT

Embodiments of the present invention relate to a method and system for evaluating selection conditions associated with variants of components of a multi-component configurable product for consistency and completeness.

20 Claims, 7 Drawing Sheets $S_1$: HP=100 AND color=red $S_2$: HP=150 OR color=blue $S_3$: HP=150 AND color=green Restriction $R_1$: IF HP = 100 THEN color ≠ blue
Restriction $R_2$: IF HP = 150 THEN color ≠ red

| Char/Cond | Value | 100 red | 150 red | 100 blu | 150 blu | 100 gre | 150 gre |
|---|---|---|---|---|---|---|---|
| HP | 100 | 1 | 0 | 1 | 0 | 1 | 0 |
| Color | red | 1 | 1 | 0 | 0 | 0 | 0 |
| $s_1$ | | 1 | 0 | 0 | 0 | 0 | 0 |

FIG. 4

| Cond | 100 red | 150 red | 100 blu | 150 blu | 100 gre | 150 gre |
|---|---|---|---|---|---|---|
| $s_1$ | 1 | 0 | 0 | 0 | 0 | 0 |
| $s_2$ | 0 | 1 | 1 | 1 | 0 | 1 |
| $s_3$ | 0 | 0 | 0 | 0 | 0 | 1 |
| $r_1$ | 0 | 0 | 1 | 0 | 0 | 0 |
| $r_2$ | 0 | 1 | 0 | 0 | 0 | 0 |
| f | 0 | 1 | 1 | 0 | 0 | 0 |
| n | 0 | 0 | 0 | 0 | 1 | 0 |
| $i_{23}$ | 0 | 0 | 0 | 0 | 0 | 1 |

FIG. 5

METHOD AND SYSTEM FOR CHECKING CONSISTENCY AND COMPLETENESS OF SELECTION CONDITIONS IN A PRODUCT CONFIGURATION SYSTEM

FIELD OF THE INVENTION

Embodiments of the present invention relate generally to computer-based product configuration systems, and more particularly to a method and system for efficiently checking for consistency and completeness in the specification of selection conditions for components in a product being configured.

BACKGROUND INFORMATION

Computer software tools have become indispensable to managing the complexity entailed in designing and manufacturing many modern products. Automobiles are one example of such products.

One aspect of the complexity involved in the design and manufacture of an automobile is the great number and variability of its constituent parts. Typically an automobile model is assembled from a catalogue of parts according to a particular set of design specifications. Because of the number and variability of parts, it can be difficult for designers to ensure that the combinations of the parts are correct.

An approach that uses a computer-based system and associated software to help manage this aspect of complexity is described in U.S. Pat. No. 6,233,094 ('094). As described in the '094 patent, a complex product such as an automobile may be represented in terms of a hierarchical data structure. A top or highest node of the data structure represents the end product (e.g., a compact car), while lower or subordinate nodes represent the components of the end product and associated production processes. A data structure of this kind, used in conjunction with, for example, a graphical user interface (GUI) with various different "views" tailored to specific user needs, helps to simplify design and production.

More specifically, the GUI may enable users, e.g., designers, to specify particular values for characteristics of a desired end product. The characteristics act to select particular variants of components of the end product. That is, a component may be represented in terms of its function within a product or as an abstraction of materials that may be used for the component, and there may be a number of possible variants associated with the component. The variants may be actual concrete realizations of the function or abstraction of the component: for example, one concrete realization of a component abstracted as a "seat" could be a leather, bucket seat, while another might a be a vinyl, bench-type seat. Based on the characteristics of a desired end product, only one of these realizations might be suitable for inclusion in the end product.

The foregoing is a very simple example; in actual practice, there may be hundreds or thousands of components and associated variants within a node hierarchy. Accordingly, there is a need to ensure that the selection of variants is correct: i.e., that it does not result, for example, in different variants being selected for the same component, or in incompatible components being combined. One way in which this need is addressed in the art is to provide user-defined "selection conditions" associated with component variants. A selection condition defines a set of conditions under which a particular variant of a component may be selected for inclusion into a product.

In a design and manufacturing process for a complex product such as an automobile, such selection conditions are typically very numerous, and change frequently. To prevent errors, the selection conditions need to be "consistent" and "complete," meaning, as explained in more detail further on, that at least one and at most one variant of a component should be selected. To ensure consistency and completeness, a software-implemented method used in the prior art evaluates a group of selection conditions for compliance with a set of rules and constraints. However, this prior art method uses a two-step process that first converts selection conditions into a somewhat lengthy and cumbersome form of logical expression, and then applies constraints to the converted expressions. Execution of the method can be comparatively slow, especially as the number of selection conditions increases. This may be frustrating to users when selection conditions change frequently, as they typically do.

In view of the foregoing considerations, an approach is needed to more efficiently evaluate selection conditions for consistency and completeness.

SUMMARY OF THE INVENTION

Embodiments of the present invention relate to a method and system for evaluating selection conditions associated with variants of components of a multi-component configurable product for consistency and completeness. The embodiments may include forming a bit matrix corresponding to combinations of values of characteristics of the product, and applying the selection conditions to the bit matrix to form bit strings or vectors representing the selection conditions. Logical operations may then be performed on the bit strings to determine whether the corresponding selection conditions are consistent and complete. Bit strings representing "forbidden" combinations of characteristics and combinations not covered by the selection conditions may also be formed. Results of the logical operations may be output to a user in the form of, among other things, a list of inconsistent selection conditions, allowing him or her to make the appropriate corrections. Because the evaluation of the selection conditions uses bit operations, it is significantly faster than prior art methods.

BRIEF DESCRIPTION OF THE DRAWINGS

FIG. 4 shows an example of a bit string or vector formed by applying a selection condition to the variance space matrix;

FIG. 5 shows a results matrix containing information obtained by further operations on the variance space matrix and resulting bit strings;

DETAILED DESCRIPTION

Figure 1:
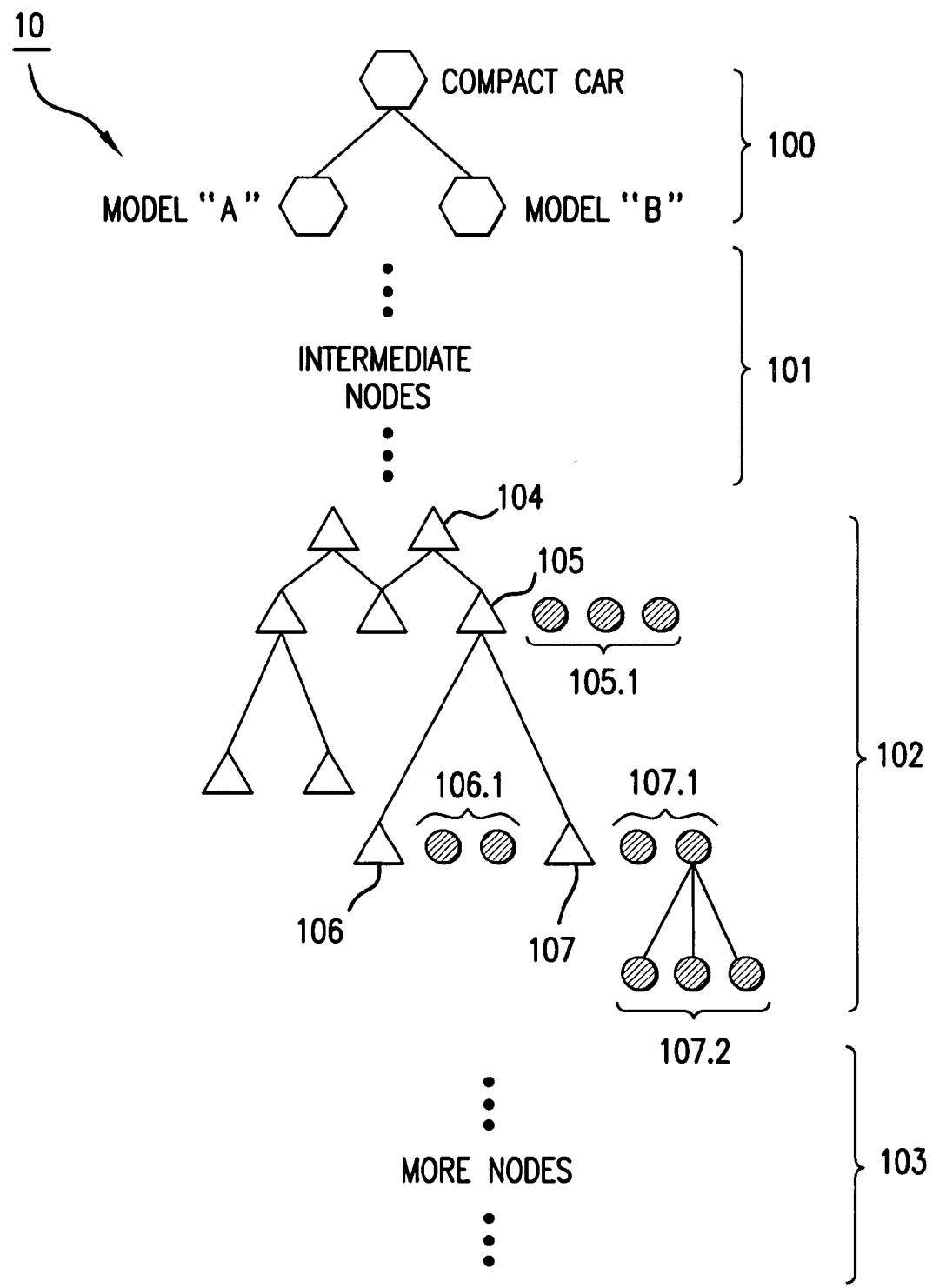
FIG. 1 shows an example of a hierarchical node structure according to embodiments of the present invention.

Embodiments of the present invention could be implemented as part of software for product design and manufacture as described above. In particular, embodiments of the present invention could be used in association with a product configuration system that uses a hierarchical data structure. FIG. 1 shows an example of a hierarchical data structure 10 corresponding to a "configurable product." "Configurable" here means, among other things, that by entering specific values for characteristics of an end product, an end product tailored to, for example, particular customers or markets may be defined. The configuring process may generate a list of components referred to as an "order bill of materials" (order BOM) that describes everything needed to produce a given end product according to some specific customer or production order. The overall structure of nodes and variants from which an order BOM may be configured may be referred to as a "super" BOM. The specific values for the characteristics could be entered, for example, via a GUI as described above, or some other form of user input.

Referring to FIG. 1, high-level nodes 100 include a top-level node that may represent an end product, such as a compact car, and high-level variants such as a model "A" and a model "B" of the compact car. The node structure 10 may further comprise intermediate nodes 101, not illustrated in detail, below the high level nodes 100. A structure of additional intermediate nodes 102, below nodes 101, is shown with some particularity as an illustrative example. The node structure 10 may further comprise still more nodes 103, not shown in detail, at a lower level.

As the node structure 10 is traversed from high-level nodes to low-level nodes, the nodes may be viewed as representing components of the end product at progressively finer levels of granularity. For example, node 104 could represent, generically, "an engine" while nodes 105–107 represent specific components of the engine and associated variants thereof. For example, node 105 could represent a specific engine component, and associated variants 105.1 could represent three different possible concrete realizations of that specific engine component. Along similar lines, nodes 106 and 107 could represent components of component 105, and associated variants 106.1 and 107.1, respectively. There could be variants of variants 107.2 in the node structure 10.

Figure 2:
FIG. 2 shows an example of possible variants and associated selection conditions for an example node of FIG. 1.

Simply for purposes of illustrative example, the following discussion will refer to node 105 and associated variants 105.1. Node 105 may be referred to as a "structure" node: i.e., a node that represents a function in a product or an abstraction of concrete materials corresponding to a component. FIG. 2 shows a more detailed view of structure node 105 and associated variants 105.1, or more specifically, variants $C_1$, $C_2$ and $C_3$. Variants $C_1$, $C_2$ and $C_3$ represent three different possible concrete realizations for the component represented by structure node 105. Further, there are selection conditions $S_1$, $S_2$ and $S_3$ each respectively associated with variants $C_1$, $C_2$ and $C_3$.

As described above, the selection conditions $S_1$, $S_2$ and $S_3$ are user-defined criteria for determining whether or not to allow a given variant to be included in an order bill of materials. For convenience, the selection conditions are illustrated as logical expressions using Boolean operators, but the selection conditions could take other forms.

As further described earlier, a configuration of a product involves assigning specific values for characteristics of the product. Particular variants may then be selected based on the values specified, as they are applied to selection conditions. In FIG. 2, "HP" (horsepower) and "color" are characteristics; "100" and "150" are specific values that may be assigned to the HP characteristic, and "red," "blue," and "green" are specific values that may be assigned to the color characteristic. When, for a given selection condition, the Boolean operators linking the specific values assigned to the characteristics evaluate to logic "TRUE," a corresponding variant will be included in the bill of materials; otherwise, it will not be. For example, $C_1$ may be the only suitable variant of structure node 105 based on the combination of values of the characteristics that HP is to be 100, and the car color is to be red, as required for selection condition $S_1$ to evaluate to TRUE. Similarly, $C_2$ may be the only suitable variant of structure node 105 based on the combination of values of characteristics that HP is to be 150, or the car color is to be blue, as required for selection condition $S_2$ to evaluate to TRUE. $C_3$ may be the only suitable variant based on the combination of values of the characteristics that HP is to be 150, and the car color is to be green, as required for selection condition $S_3$ to evaluate to TRUE.

It may be appreciated in view of the foregoing example that, among other things, the selection conditions serve to prevent incompatible variants from being included in a design. For instance, if a product being designed is a car, designers want to ensure it has only one engine, of a certain type. The selection conditions help to ensure this. In particular, the selection conditions help to guarantee that at most one variant is selected for a component. When the selection conditions have this property, they are said to be "consistent." Further, selection conditions help to guarantee that at least one variant is selected for a component. When the selection conditions have this property, they are said to be "complete."

However, it should further be clear that if there are errors in the selection conditions, their beneficial function may be compromised. Accordingly, with the foregoing example in mind, a more generalized description will now be given of embodiments of a method and system in accordance with the present invention for ensuring that selection conditions associated with component variants as described above are consistent and complete. These requirements will be better understood in view of the definitions set forth below:

1. A variance scheme V is a finite set $\{C1, \ldots, C_n\}$ of characteristics. Every characteristic $C_i$ has a finite set of values $V(i)=\{v_{i1}, \ldots, v_{im_i}\}$.

2. The variance space S(V) of V is the set of all combinations of the values: i.e., the Cartesian product of the sets V(1), ... V(n).

3. A selection condition A over V is any logical expression using only the characteristics and values of V.

4. A restriction R can be formulated as two logical expressions denoting an implication (A->B) (A implies B) or as a single logical expression A.

(a) when a restriction R is expressed in the form A->B, the forbidden space F of R is the set of all elements s of S(V) with (A->B)(s)=FALSE (the notation E(s), where E is some logical expression, means "evaluate expression E for combination s".)

(b) when a restriction R is expressed in the form A, the forbidden space F is the set of all elements s of S(V) with A(s)=TRUE (where, as noted above, A(s) means "evaluate expression A for combination s"); i.e., A can be interpreted as a selection condition for the forbidden space (c) note that the implication form A->FALSE is just equivalent to the selection condition A.

Each variant $C_1, \ldots, C_n$ of a structure node may have a corresponding selection condition $S_1, \ldots, S_n$, as shown in FIG. 2. As indicated in (3) above, the selection conditions may be expressed as logical operators on specific values assigned to the set of characteristics $V=\{C1, \ldots, C_n\}$. In order for the selection conditions to be consistent, the following must hold: for every pair $S_i$, $S_j$ and every assignment a of values to the characteristics, $S_i(a)$ AND $S_j(a)=$ FALSE. This is equivalent to stating that selection conditions may not overlap or that only one variant per structure node may be selected.

Further, in order for the selection conditions to be complete, the following must hold: $S_1(a)$ OR ... OR $S_n(a)=$ TRUE. This is equivalent to stating that at least one selection condition must be satisfied, or that at least one variant must be selected. Taken together, the requirements that selection conditions be consistent and complete means that at least one variant and at most one variant must be selected.

Restrictions R (see (4) above) may need to be accounted for when determining consistency and completeness. More specifically, when values or combination of values of V linked by logical operators meet conditions defining forbidden space F, they are not subject to consistency and completeness requirements.

According to embodiments of the present invention, selection conditions may be evaluated for consistency and completeness by forming a "variance space" bit matrix that encodes all possible combinations contained in the variance space. Then, bit strings or vectors representing selection conditions and restrictions may be formed for all the combinations in the variance space, by an application of logical operations to information in the variance space matrix. More specifically, bit strings $s_1, \ldots, s_n$ representing the allowed combinations of values of characteristics of respective selection conditions $S_1, \ldots, S_n$, and bit strings $r_1, \ldots, r_m$ representing restrictions $R_1, \ldots, R_m$, may be formed.

Figure 3:
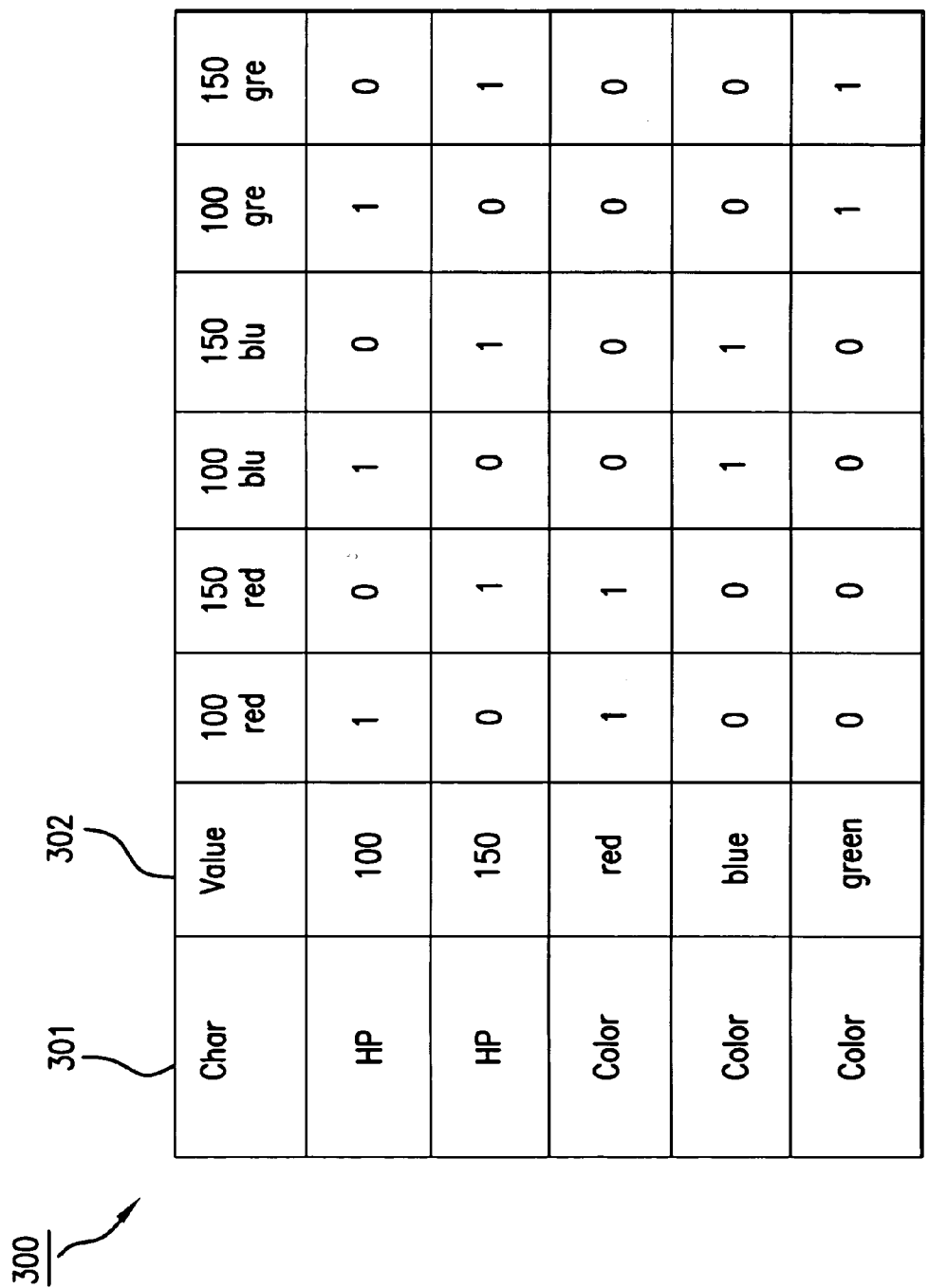
FIG. 3 shows a variance space matrix according to embodiments of the invention.

Still more specifically, bit strings $s_1, \ldots, s_n$ may be formed by applying the logical operations defined in the selection conditions $S_1, \ldots, S_n$ to the information in the variance space matrix. Returning to the example of FIG. 2, variance V={HP, color}; V(1)={100, 150}; and V(2)={red, blue, green}. Thus, variance space S(V)={(100, red), (100, blue), (100, green), (150, red), (150, blue), (150, green)}. FIG. 3 shows a corresponding variance space bit matrix 300. More specifically, for characteristics HP and color, all possible combinations of assigned values 100, 150 and red, blue, green are shown. That is, a logic "1" in a given row/column indicates a possible combination of specific values 302 assigned to characteristics 301.

FIG. 4 shows a result of applying selection condition $S_1$ to the variance space matrix 300 to form a bit string or vector $s_1$. More specifically, only the combination HP=100 AND color=red evaluates to TRUE under selection condition $S_1$, and so a corresponding bit 400 is set to logic "1" in a bit string $s_1$, while all other bits are logic "0".

Returning now to FIG. 2, there are two restrictions: $R_1$: IF (HP=100) THEN (color .NE. blue) (i.e., if HP is 100, then color may not be blue); and $R_2$: IF (HP=150) THEN (color . NE. red) (i.e., if HP is 150, then color may not be red). Thus, the value assignments HP=100 AND color=blue, and HP=150 AND color=red should not be included in a result of the consistency and completeness evaluations, because these are forbidden combinations (elements of forbidden space F). In order to effectively exclude elements of forbidden space from a result of the consistency and completeness evaluations, a bit string f, corresponding to all the elements of the forbidden space, may be formed. The f bit string may be applied to other bit strings, as described in more detail below, to eliminate elements that are in forbidden space from a result of the consistency and completeness evaluations.

Note that these restrictions have the form A->B, where, e.g., A is "HP=100" and B is "color .NE. blue". The equivalent of the latter in the form A would be HP=100 AND color=blue, which may be interpreted as a selection condition for forbidden space F.

Further operations on the bit strings $s_1, \ldots, s_n$ and $r_1, \ldots, r_m$ may be performed as follows, to form bit string f (corresponding to forbidden space F), bit string n (corresponding to "free space"), and bit string $i_{ij}$, to efficiently check for consistency and completeness:

(i) f:=$r_1$ OR ... OR $r_m$ (ii) n:=NOT ($s_1$ OR ... OR $s_n$ OR f) (representing those combinations of characteristic values that are neither covered by a selection condition nor subject to a restriction)

(iii) inconsistency $i_{ij}$ between selection conditions $S_i$ and $S_j$:=$s_i$ AND $s_j$ AND NOT f.

FIG. 5 shows a results matrix 500 where all the selection conditions corresponding to variants shown in FIG. 2 have been applied to the variance space matrix 300 to form bit strings $s_1$, $s_2$ and $s_3$, and operations (i), (ii) and (iii) have been carried out. As can be seen in FIG. 5, selection condition $S_1$ (HP=100 AND color=red) evaluates to TRUE for only one combination, and a corresponding bit is set in a bit string $s_1$ in the results matrix 500. Selection condition $S_2$ (HP=150 OR color=blue) evaluates to TRUE for four combinations in the variance space matrix and the corresponding bits are set to logic "1" in a bit string $s_2$ in the results matrix 500. Selection condition $S_3$ (HP=150 AND color=green) evaluates to TRUE for only one combination, and a corresponding bit is set in a bit string $s_3$.

Bit string or vector r corresponds to the restrictions $R_1$ and $R_2$, where the restrictions are expressed by a bit having the value logic "1" for the forbidden combinations HP=100 AND color=blue, and HP=150 AND color=red, respectively, while all other bits in the bit string have the value logic "0".

Bit string f, formed by =$r_1$ OR ... OR $r_m$ corresponds to the set of all restricted combinations.

Bit string n, formed by the logical operation NOT ($s_1$ OR ... OR $s_n$ OR f) corresponds to "free space": i.e., those combinations which are neither covered by a selection condition nor part of forbidden space F. Bit string n may be formed as an efficient way to check for completeness: that is, if bit string n contains only "0"s, then the selection conditions are complete. Put another way, if bit string n contains a "1", this represents a possibility for a combination of characteristic values that does not satisfy a selection condition, or is not restricted; thus it is not guaranteed that $S_1(a)$ OR ... OR $S_n(a)$=TRUE, as is required for completeness. For example, the "1" in bit string n in FIG. 5 shows that selection conditions of FIG. 2 are not complete, because no condition tests for the possible combination HP=100 AND color=green, and this combination is not subject to a restriction.

Finally, the bottom row of matrix 500 is a bit string $i_{23}$, formed by the logical operation $s_2$ AND $s_3$ AND NOT f, showing an inconsistency between selection conditions $S_2$ and $S_3$. That is, the bit in the combination corresponding to HP=150 AND color=green has a value of logic "1", indicating that both $S_2$ and $S_3$ permit this combination. This situation, as noted earlier, could lead to two different variants being selected for the same component, which is not desirable.

According to embodiments of the present invention, the information in the results matrix could be reported to a user. The information reported could include pairs of inconsistent selection conditions, and lists of combinations that are neither covered by a selection condition nor forbidden by a restriction ("free space"). The information could be output to a computer display screen, for example, or to print. The information could enable a user to correct errors in the formulation of his/her selection conditions.

Figure 6:
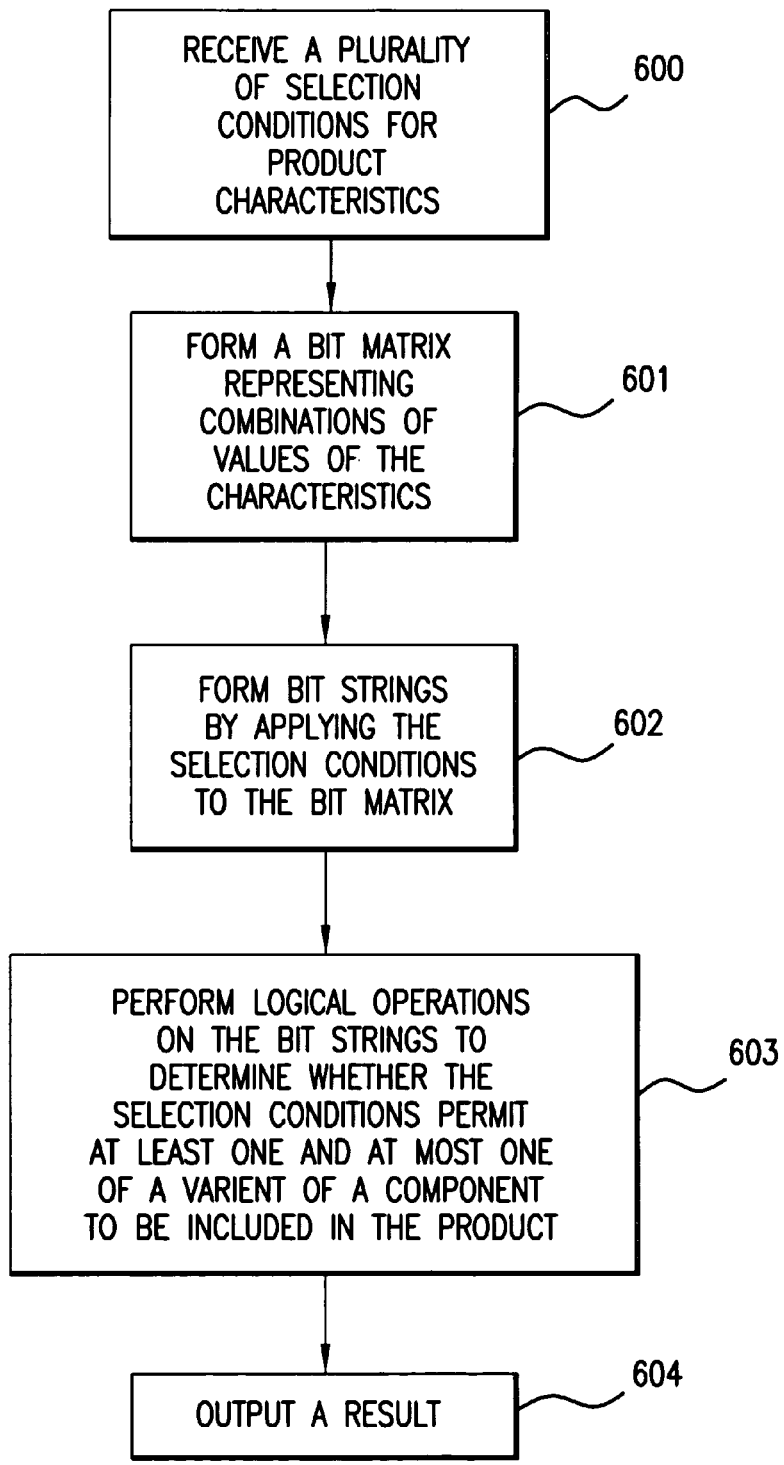
FIG. 6 shows a flowchart illustrating a method according to embodiments of the invention.

A user could formulate a set of selection conditions, for example using a GUI, and then invoke, via the GUI, software implementing embodiments of a method according to the present invention to check the selection conditions for consistency and completeness. Such a method is illustrated in flowchart form in FIG. 6. In block 600, a plurality of selection conditions, for example, formulated by a user pursuant to the configuration of some product, is received. The selection conditions define permissible combinations of values of characteristics of the product. A bit matrix is formed containing information representing combinations of the values of the characteristics, block 601. As shown in block 602, bit strings or vectors are formed by applying the selection conditions to the bit matrix; the bit strings represent the permissible combinations of a corresponding selection condition. Then, as shown in block 603, logical operations are performed on the bit strings to determine whether the selection conditions are consistent and complete: i.e., that they permit at least one and at most one of a variant of a component to be included in the product. A result of the operations of blocks 600–603 may be output to a user, as shown in block 604.

As noted earlier, because embodiments of the invention use bit operations, execution may be significantly faster than prior art methods. For example, in constructing the variance space matrix, bit operations like multiplying or shifting of bit strings may be used. Such operations can take advantage of machine architecture for enhanced speed of execution. Moreover, the formation of bit strings $s_1, \ldots, s_n$ and $r_1, \ldots, r_m$ may be done very quickly, because all the combinations in the variance space matrix may be processed substantially simultaneously using bit string operations.

According to embodiments, when forming the variance space matrix, the characteristics may be sorted by the greatest power of 2 that divides the number of the corresponding values. This may make the best use of machine architecture, because the built-in operations for bit strings actually work on byte strings (i.e., groups of 8 bits).

If the variance space is large, in forming the variance space bit matrix, memory could be conserved by compressing the $m_i$ matrix rows corresponding to characteristics $C_i$ into approximately $\log_2 m_i$ rows by numbering the values of $C_i$ with $1, \ldots, m_i$ and storing the binary representation of the value's number in the variance space bit matrix.

According to embodiments, the variance space bit matrix could be split into a plurality of sub-matrices. The matrices could be processed in parallel to save time, or serially to save memory. One way to split the variance space bit matrix would be to choose a characteristic with a number of values that equals (at least approximately) the desired number of sub-matrices, and to create a sub-matrix for every value of the characteristic. The bit pattern for the chosen characteristic is very simple for the sub-matrices: all bits are set in the row of the value corresponding to the sub-matrix; no bit is set in the other rows. The patterns of all other characteristics do not change, but they are repeated less often.

Figure 7:
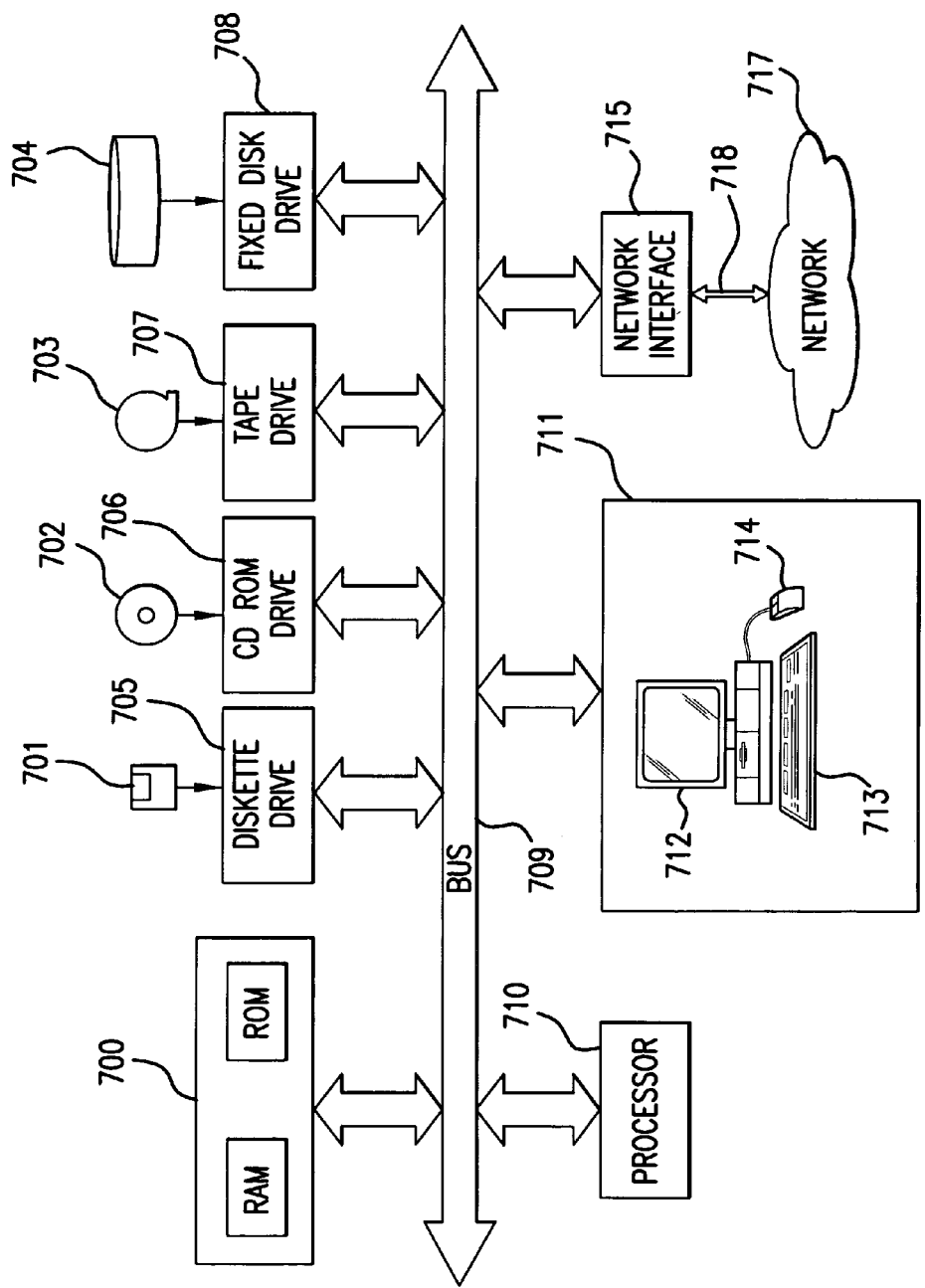
FIG. 7 shows a computer system for implementing embodiments of the invention.

FIG. 7 shows a high-level representation of a computer system for implementing embodiments of the present invention, such as might be realized by a variety of known and commercially available hardware and software elements. The system comprises a memory 700 including ROM and RAM, processor 710 and user interface 711 comprising a video display 712, keyboard 713 and mouse 714. Elements may communicate via system bus 706. The system may further comprise a network 717 connected by a network medium 718 and network interface 715.

A computer program or collection of programs comprising computer-executable instructions for performing a method according to embodiments of the present invention may be stored and transported on computer-usable media such as diskette 701, CD-ROM 702, magnetic tape 703 and fixed disk 704. To perform the embodiments, computer instructions may be retrieved from the computer-usable media 701–704 using their respective drives 705–708 into memory 700, and executed by a processor 710. The functionality disclosed hereinabove for performing the embodiments may find specific implementations in a variety of forms, which are considered to be within the abilities of a programmer of ordinary skill in the art after having reviewed the specification.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A method for evaluation of selection conditions corresponding to variants of components in a configurable product, comprising:
   receiving a plurality of selection conditions defining permissible combinations of values of characteristics of the product;
   forming a bit matrix containing information representing combinations of the values of the characteristics;
   forming bit strings by applying the selection conditions to the bit matrix, the bit strings representing the permissible combinations;
   performing logical operations on the bit strings to determine whether the selection conditions permit at least one and at most one of a variant of a component to be included in the configurable product; and
   outputting a result to a user.

2. The method of claim 1, further comprising receiving a restriction on combinations of values of the characteristics, and forming a corresponding bit string.

3. The method of claim 2, further comprising forming a bit string containing information representing combinations of values of the characteristics that are neither covered by the selection conditions nor subject to a restriction.

4. A method for evaluating selection conditions associated with variants of components of a multi-component configurable product, comprising:
   (a) forming a bit matrix corresponding to combinations of values of characteristics of the product;
   (b) applying the selection conditions to the bit matrix, the selection conditions defining allowed combinations of values of the characteristics, to determine whether the selection conditions provide for selecting at most one and at least one of variants corresponding to a component; and
   (c) outputting a result to a user.

5. The method of claim 4, wherein information in the bit matrix represents all possible combinations of values for the characteristics that are subject to the selection conditions.

6. The method of claim 4, wherein the selection conditions are expressed as logical operations on the combinations of values.

7. The method of claim 4, wherein (b) comprises forming a first bit string corresponding to a first selection condition, the first bit string containing logic values representing combinations of values of the characteristics allowed by the first selection condition.

8. The method of claim 7, wherein (b) further comprises forming a bit string containing logic values representing forbidden combinations of the values of the characteristics.

9. A method for evaluating selection conditions associated with variants of components of a multi-component configurable product, comprising:
   (a) forming a bit matrix corresponding to combinations of values of characteristics of the product;
   (b) applying the selection conditions to the bit matrix, the selection conditions defining allowed combinations of values of the characteristics, to determine whether the selection conditions provide for selecting at most one and at least one of variants corresponding to a component; and
   (c) outputting a result to a user;
   wherein (b) comprises forming a first bit string corresponding to a first selection condition, the first bit string containing logic values representing combinations of values of the characteristics allowed by the first selection condition; and
   wherein (b) further comprises:
   forming a second bit string corresponding to a second selection condition, the second bit string containing logic values representing combinations of values of the characteristics allowed by the second selection condition; and
   performing a logic operation on the first and second bit strings to determine whether the first and second selection conditions allow a same combination of values of the characteristics.

10. The method of claim 9, wherein the logic operation ANDs the first and second bit strings.

11. A system for evaluation of selection conditions corresponding to variants of components in a configurable product, comprising:
   a memory containing computer-executable instructions; and
   a processor coupled to the memory to execute the instructions, the instructions when executed performing a process comprising:
      receiving a plurality of selection conditions defining permissible combinations of values of characteristics of the product;
      forming a bit matrix containing information representing combinations of the values of the characteristics;
      forming bit strings by applying the selection conditions to the bit matrix, the bit strings representing the permissible combinations; and
      performing logical operations on the bit strings to determine whether the selection conditions permit at least one and at most one of a variant of a component to be included in the configurable product.

12. The system of claim 11, wherein the selection conditions are expressed as logical operations on values assigned to the characteristics.

13. The system of claim 11, the process further comprising receiving a restriction on combinations of values of the characteristics, and forming a corresponding bit string.

14. The system of claim 11, the process further comprising forming a bit string containing information representing combinations of characteristics that are neither covered by the selection conditions nor subject to a restriction.

15. The system of claim 11, further comprising a graphical user interface configured to enable a user to invoke an execution of the process via an input device, and receive a result of the execution of the process.

16. A machine-readable medium storing computer-executable instructions, the instructions when executed performing a process for evaluation of selection conditions corresponding to variants of components in a configurable product, the process comprising:
   receiving a plurality of selection conditions defining permissible combinations of values of characteristics of the product;
   forming a bit matrix containing information representing combinations of the values of the characteristics;
   forming bit strings by applying the selection conditions to the bit matrix, the bit strings representing the permissible combinations; and
   performing logical operations on the bit strings to determine whether the selection conditions permit at least one and at most one of a variant of a component to be included in the configurable product.

17. The machine-readable medium of claim 16, the process further comprising receiving a restriction on combinations of values of the characteristics, and forming a corresponding bit string.

18. The machine-readable medium of claim 17, further comprising forming a bit string containing information representing combinations of values of the characteristics that are neither covered by the selection conditions nor subject to a restriction.

19. A machine-readable medium storing computer-executable instructions for performing a method for evaluating selection conditions associated with variants of components of a multi-component configurable product, the method comprising:
   (a) forming a bit matrix corresponding to combinations of values of characteristics of the product; and
   (b) applying the selection conditions to the bit matrix, the selection conditions defining allowed combinations of values of the characteristics, to determine whether the selection conditions provide for selecting at most one and at least one of variants corresponding to a component.

20. A machine-readable medium storing computer-executable instructions for performing a method for evaluating selection conditions associated with variants of components of a multi-component configurable product, the method comprising:
   (a) forming a bit matrix corresponding to combinations of values of characteristics of the product; and
   (b) applying the selection conditions to the bit matrix, the selection conditions defining allowed combinations of values of the characteristics, to determine whether the selection conditions provide for selecting at most one and at least one of variants corresponding to a component:
   wherein (b) comprises:
   forming a first bit string corresponding to a first selection condition, the first bit string containing logic values representing combinations of values of the characteristics allowed by the first selection condition;

forming a second bit string corresponding to a second selection condition, the second bit string containing logic values representing combinations of values of the characteristics allowed by the second selection condition; and ANDing the first and second bit strings to determine whether the first and second selection conditions allow a same combination of values of the characteristics.

* * * * *